United States Patent
Butts

(10) Patent No.: US 9,301,584 B2
(45) Date of Patent: Apr. 5, 2016

(54) CARRYING CASE ASSEMBLY

(71) Applicant: Shane Butts, Anderson, IN (US)

(72) Inventor: Shane Butts, Anderson, IN (US)

(*) Notice: Subject to any disclaimer, the term of this patent is extended or adjusted under 35 U.S.C. 154(b) by 0 days.

(21) Appl. No.: 14/459,791

(22) Filed: Aug. 14, 2014

(65) Prior Publication Data

US 2016/0045002 A1 Feb. 18, 2016

(51) Int. Cl.
| | |
|---|---|
| *A45F 5/00* | (2006.01) |
| *F16M 13/00* | (2006.01) |
| *A45C 11/00* | (2006.01) |
| *H05K 5/02* | (2006.01) |
| *H05K 5/00* | (2006.01) |
| *H05K 5/03* | (2006.01) |
| *H04M 1/04* | (2006.01) |

(52) U.S. Cl.
CPC .............. *A45C 11/00* (2013.01); *H05K 5/0086* (2013.01); *H05K 5/023* (2013.01); *H05K 5/0234* (2013.01); *H05K 5/03* (2013.01); *A45C 2011/002* (2013.01); *A45F 2200/0516* (2013.01); *F16M 13/00* (2013.01); *F16M 13/005* (2013.01); *H04M 1/04* (2013.01)

(58) Field of Classification Search
CPC ................. A45C 2011/002; A45F 2200/0516; H04M 1/04; F16M 13/00; F16M 13/005
USPC ........................ 224/218; 361/679.59; 248/688
See application file for complete search history.

(56) References Cited

U.S. PATENT DOCUMENTS

| | | | |
|---|---|---|---|
| 5,768,645 A * | 6/1998 | Kessler | 396/376 |
| 5,918,957 A * | 7/1999 | Bovio et al. | 312/223.2 |
| 6,508,451 B1 | 1/2003 | Blythe | |
| 6,678,153 B2 * | 1/2004 | Chen et al. | 361/679.21 |
| 7,301,759 B2 * | 11/2007 | Hsiung | 361/679.27 |
| D559,230 S * | 1/2008 | Griffin et al. | D14/217 |
| D592,760 S * | 5/2009 | Diener et al. | D24/231 |
| 7,706,673 B1 * | 4/2010 | Staudinger et al. | 396/58 |
| 8,016,107 B2 | 9/2011 | Emsky | |
| 8,231,099 B2 * | 7/2012 | Chen | 248/688 |
| D679,271 S | 4/2013 | Liu | |
| 8,714,347 B2 * | 5/2014 | Mongan et al. | 206/45.24 |
| D730,887 S * | 6/2015 | Lindemann | D14/253 |
| 2006/0113382 A1 * | 6/2006 | Singgih et al. | 235/383 |
| 2006/0257137 A1 * | 11/2006 | Fromm | 396/420 |
| 2010/0059649 A1 | 3/2010 | Buxton | |
| 2011/0279269 A1 | 11/2011 | Gerber | |
| 2012/0025039 A1 | 2/2012 | Segal | |
| 2013/0206612 A1 | 8/2013 | Chun | |
| 2015/0102074 A1 * | 4/2015 | Elgan | 224/218 |

FOREIGN PATENT DOCUMENTS

| | | |
|---|---|---|
| DE | 29713765 U1 * | 9/1997 |
| DE | 102013006993 A1 * | 10/2014 |
| WO | WO2013116842 | 8/2013 |

* cited by examiner

*Primary Examiner* — Justin Larson

(57) ABSTRACT

A carrying case assembly for positioning an electronic device to take a self portrait includes a housing structured to insertably receive the electronic device. An arm is movably coupled to the housing. The arm is positionable between a deployed position and a stored position. The arm is positionable in an extended position after the arm is positioned in the deployed position. The arm may be gripped by a user. The electronic device is retained a selected distance away from the user.

7 Claims, 3 Drawing Sheets

CARRYING CASE ASSEMBLY

BACKGROUND OF THE DISCLOSURE

Field of the Disclosure

The disclosure relates to carrying devices and more particularly pertains to a new carrying device for positioning an electronic device to take a self portrait.

SUMMARY OF THE DISCLOSURE

An embodiment of the disclosure meets the needs presented above by generally comprising a housing structured to insertably receive an electronic device. An arm is movably coupled to the housing. The arm is positionable between a deployed position and a stored position. The arm is positionable in an extended position after the arm is positioned in the deployed position. The arm may be gripped by a user. The electronic device is retained a selected distance away from the user.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
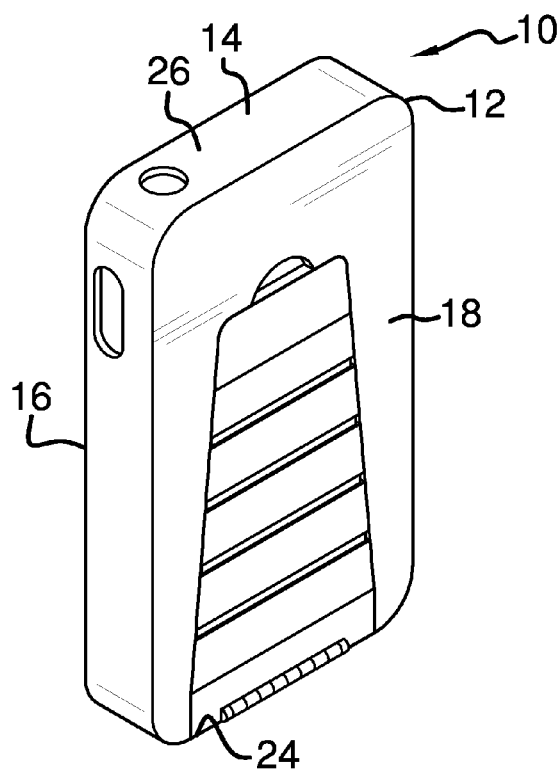
FIG. 1 is a perspective view of a carrying case assembly according to an embodiment of the disclosure.
Figure 2:
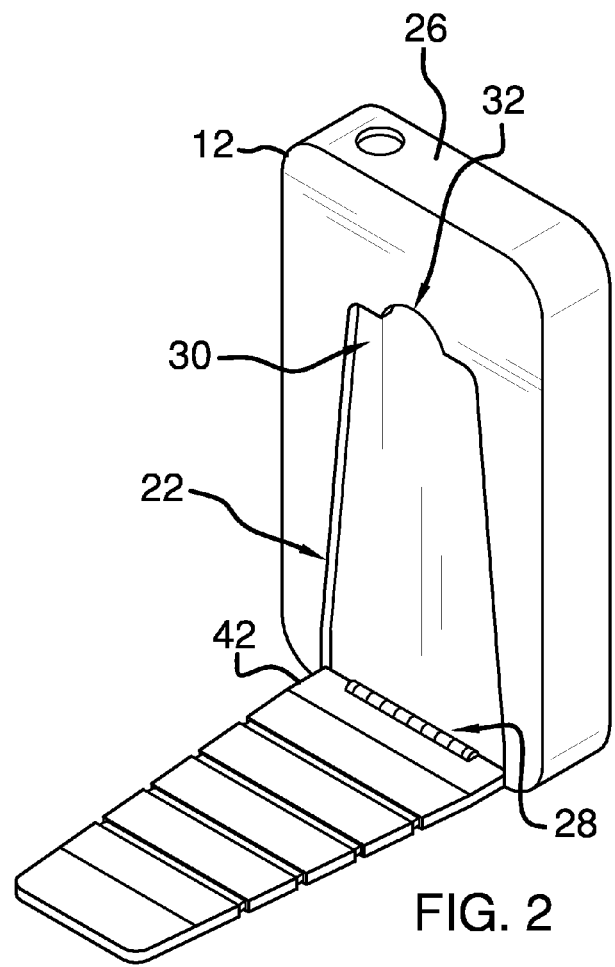
FIG. 2 is a back perspective view of an embodiment of the disclosure.
Figures 3, 4:
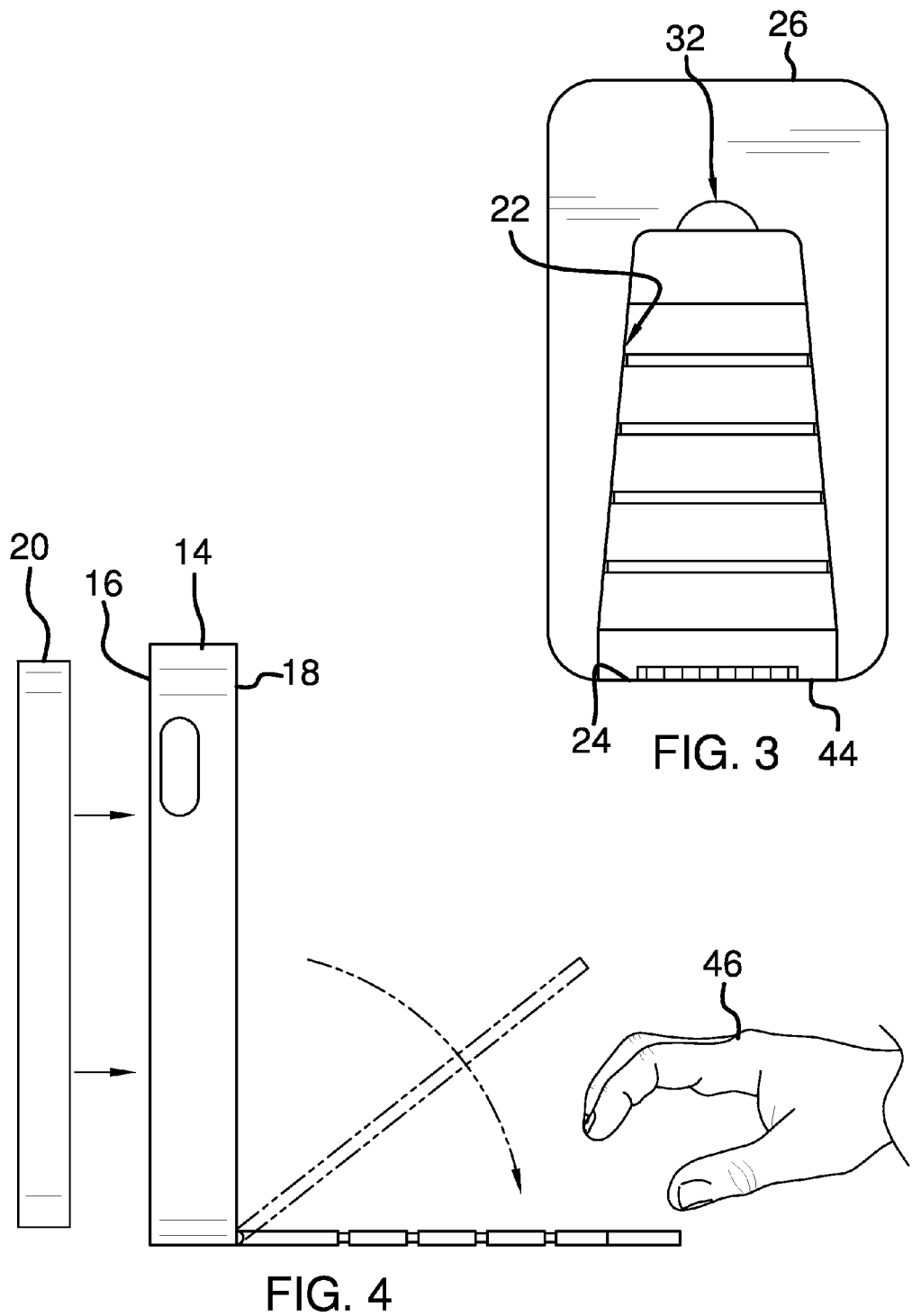
FIG. 3 is a back view of an embodiment of the disclosure.
FIG. 4 is a right side view of an embodiment of the disclosure.
Figure 5:
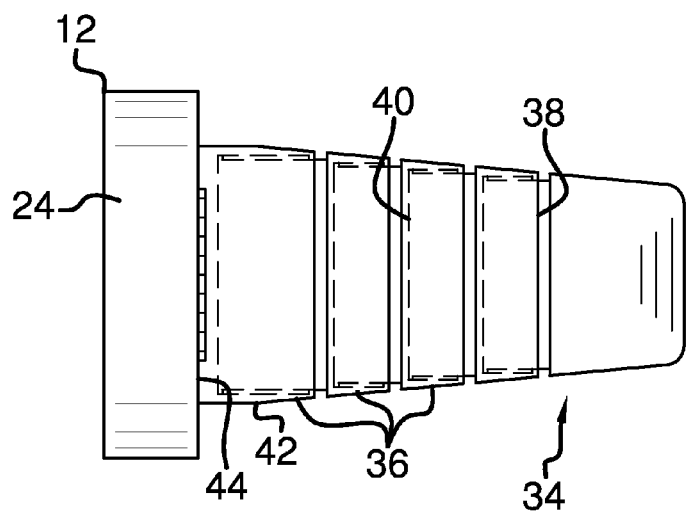
FIG. 5 is a bottom view of an embodiment of the disclosure.
Figure 6:
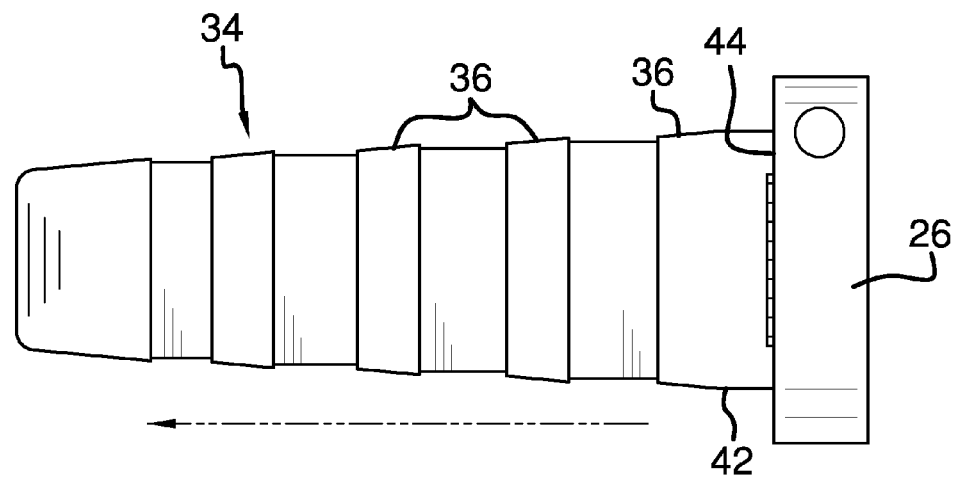
FIG. 6 is a top view of an embodiment of the disclosure.

With reference now to the drawings, and in particular to FIGS. 1 through 6 thereof, a new carrying device embodying the principles and concepts of an embodiment of the disclosure and generally designated by the reference numeral 10 will be described.

As best illustrated in FIGS. 1 through 6, the carrying case assembly 10 generally comprises a housing 12. The housing 12 has a perimeter wall 14 extending between each of a front wall 16 and a back wall 18 of the housing 12. Moreover, the housing 12 is structured to insertably receive an electronic device 20. The housing 12 may be a smart phone case of any conventional design. Additionally, the electronic device 20 may be a smart phone.

The back wall 18 of the housing 12 has an arm well 22 extending forwardly therein. The arm well 22 extends from a bottom side 24 of the perimeter wall 14 of the housing 12 toward a top side 26 of the perimeter wall 14 of the housing 12. The arm well 22 tapers between the a lower end 28 and an upper end 30 of the arm well 22. A finger portion 32 of the arm well 22 extends upwardly from the upper end 30 of the arm well 22. The finger portion 32 of the arm well 22 has a semi-circular shape.

An arm 34 is provided. The arm 34 comprises a plurality of segments 36 of the arm 34. The plurality of segments 36 each has a front end 38 and a back end 40. The back end 40 of the segments 36 of the arm 34 are each slidably inserted into the front end 38 of an adjacent one of the segments 36. The segments 36 are additionally slidably coupled together. Moreover, the arm 34 has a telescopically adjustable length. A coupled one 42 of the segments 36 is hingedly coupled to a bottom edge 44 of the back wall 18 of the housing 12.

Each of the segments 36 of the arm 34 tapers between the back 40 and front 38 ends of the segments 36. Additionally, the segments 36 each has a trapezoidal shape. The arm 34 is positionable in a stored position. Moreover, the arm 34 is positioned within the arm well 22 in the stored position The arm 34 is positionable in a deployed position. The arm 34 extends away from the back wall 18 of the housing 12. Additionally, the arm 34 is positionable in an extended position after the arm 34 is positioned in the deployed position. The arm 34 may be gripped by a user 46 so the electronic device 20 is retained a selected distance away from the user 46.

In use, the arm 34 is positioned in the extended position when the user 46 wishes to take a self portrait photograph with the electronic device 20. The arm 34 allows the user 46 to position the electronic device 20 at a distance that improves the appearance of the self portrait. Additionally, the arm 34 is positioned in the extended position to take a group photo that includes the user 46.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A carrying case assembly comprising:
 a housing structured to insertably receive an electronic device; and
 an arm movably coupled to said housing, said arm being positionable between a deployed position and a stored position, said arm being positionable in an extended position after said arm is positioned in said deployed position such that said arm is configured to be gripped by a user wherein the electronic device is retained a selected distance away from the user, said arm comprising a plurality of segments of said arm, said segments of said arm each being slidably coupled to an adjacent one of said segments such that said arm has a telescopically adjustable length, each of said segments tapering between a back end and a front end of said segment wherein each segment has a trapezoidal shape, each of said segments having a respective planar face between said front end and said back end, said planar faces of said segments being coplanar.

2. The carrying case assembly according to claim 1, further comprising said housing having a perimeter wall extending between each of a front wall and a back wall of said housing.

3. The carrying case assembly according to claim 2, further comprising said back wall of said housing having an arm well extending forwardly therein, said arm well extending from a bottom side of said perimeter wall of housing toward a top side of said perimeter wall of said housing.

4. The carrying case assembly according to claim 1, further comprising a coupled one of said segments being hingedly coupled to a bottom edge of a back wall of said housing.

5. The carrying case assembly according to claim 4, further comprising said arm being positioned within an arm well when said arm is positioned in said stored position.

6. The carrying case assembly according to claim 4, further comprising said arm extending away from said back wall of said housing when said arm is positioned in said deployed position.

7. A carrying case assembly comprising:

a housing having a perimeter wall extending between each of a front wall and a back wall of said housing, said housing being structured to insertably receive an electronic device;

said back wall of said housing having an arm well extending forwardly therein, said arm well extending from a bottom side of said perimeter wall of housing toward a top side of said perimeter wall of said housing;

an arm, said arm comprising a plurality of segments of said arm, said segments of said arm each being slidably coupled to an adjacent one of said segments such that said arm has a telescopically adjustable length, a coupled one of said segments being hingedly coupled to a bottom edge of said back wall of said housing, each of said segments tapering between a back end and a front end of said segment wherein each segment has a trapezoidal shape, each of said segments having a respective planar face between said front end and said back end, said planar faces of said segments being coplanar;

said arm being positionable in a stored position having said arm being positioned within an arm well;

said arm being positionable in a deployed position having said arm extending away from said back wall of said housing; and said arm being positionable in an extended position after said arm is positioned in said deployed position such that said arm is configured to be gripped by a user, wherein the electronic device is retained a selected distance away from a user.

* * * * *